United States Patent
Chen

(10) Patent No.: US 7,317,279 B2
(45) Date of Patent: Jan. 8, 2008

(54) ACTIVE ORGANIC ELECTROLUMINESCENCE PANEL DISPLAY WITH BLANK LAYER COVERING CONTACT OPENING

(75) Inventor: Yun-Sheng Chen, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 184 days.

(21) Appl. No.: 10/707,705

(22) Filed: Jan. 6, 2004

(65) Prior Publication Data

US 2005/0093438 A1 May 5, 2005

(30) Foreign Application Priority Data

Oct. 30, 2003 (TW) ............... 92130175 A

(51) Int. Cl.
*H01J 1/62* (2006.01)
*H01J 63/04* (2006.01)

(52) U.S. Cl. .............. 313/504; 313/498; 313/506; 313/512

(58) Field of Classification Search ........ 313/498–500, 313/504, 506, 512; 315/169.3; 257/72, 257/98
See application file for complete search history.

(56) References Cited

U.S. PATENT DOCUMENTS

| 6,194,837 | B1 * | 2/2001 | Ozawa | 315/169.1 |
|---|---|---|---|---|
| 6,617,608 | B2 * | 9/2003 | Bae et al. | 257/40 |
| 6,740,938 | B2 * | 5/2004 | Tsunoda et al. | 257/365 |
| 6,815,887 | B2 * | 11/2004 | Lee et al. | 313/512 |
| 6,830,494 | B1 * | 12/2004 | Yamazaki et al. | 445/24 |
| 6,831,410 | B2 * | 12/2004 | Huang | 313/506 |
| 6,979,583 | B2 * | 12/2005 | Bae et al. | 438/34 |
| 2004/0178725 | A1 * | 9/2004 | Karasawa et al. | 313/506 |

FOREIGN PATENT DOCUMENTS

| CN | 1237258 | 12/1999 |
|---|---|---|
| CN | 1434668 | 8/2003 |

\* cited by examiner

*Primary Examiner*—Nimeshkumar D. Patel
*Assistant Examiner*—Kevin Quarterman
(74) *Attorney, Agent, or Firm*—Jianq Chyun IP Office

(57) ABSTRACT

An active organic electroluminescence panel display and a fabricating method thereof are disclosed. A thin film transistor array comprising a plurality of thin film transistors, a plurality of datalines and a plurality of scanlines are formed on a substrate. A passivation layer is formed on the substrate, covering the thin film transistor array. A contact opening is formed in the passivation layer for exposing a prescribed area of the array. An anode layer is formed on the passivation layer and fills into the contact opening. A blank layer is formed on the anode, covering the contact opening. A shadow mask is disposed on the blank layer. Then, a sputtering process is performed to form an organic luminescent layer. The shadow mask is then removed, and a cathode layer is formed on the organic luminescent layer for forming an active organic electroluminescence panel display.

6 Claims, 7 Drawing Sheets

ACTIVE ORGANIC ELECTROLUMINESCENCE PANEL DISPLAY WITH BLANK LAYER COVERING CONTACT OPENING

CROSS REFERENCE TO RELATED APPLICATIONS

This application claims the priority benefit of Taiwan application serial no. 92130175, filed on Oct. 30, 2003.

BACKGROUND OF INVENTION

1. Field of the Invention

The present invention relates to a display and a fabricating method thereof, and more particularly to an active organic electroluminescence panel display and a fabricating method thereof.

2. Description of the Related Art

Because of the shrinkage of semiconductor device and displays, portable devices are now available to consumers. As to displays, cathode ray tubes (CRT) dominate the market because of its high image quality and low cost. However, because of space restriction, power consumption and environmental concern, CRT still has some issues that need to be resolved. Therefore, thin film transistor liquid crystal display, which offers high image quality, small space occupation, low power consumption and radiation free, has gradually replaced CRT.

Flat panel displays include liquid crystal display (LCD), organic electroluminescence display (OELD) and plasma display panel (PDP), etc. OELD, a dots matrix type display having emissive devices, has high brightness, high efficiency, low weight, high effective contrast ratio and low power driving. The power consumption of OELD is less than those of CRT, PDP and LCD. Moreover, because its performance is independent of red, green and blue lights, OELD is now deemed as the main trend for the next generation of flat panel displays.

OELD includes active and passive drive displays depending on the driving modes. The service life and efficiency of the passive drive display will decay depending on the size and resolution thereof. The active drive OELD has gradually replaced the passive type to date.

The active drive OELD includes thin film transistors (TFT) for driving the voltage required thereby. Generally, the process of fabricating the TFT can be varied depending on a position of an indium tin oxide (ITO) anode layer, e.g. on the top or the bottom of the source/drain terminals (ITO on Top and ITO on Bottom, respectively). The process also depends on the material used, such as polysilicon or amorphous silicon, which is applied in the silicon layer. Referring to FIG. 1, during the process of fabricating the polysilicon TFT substrate, the ITO is positioned on Top of the source/drain terminals, a contact opening 114 is formed within the passivation layer 106 on the dielectric layer 102 and the source/drain 104. The ITO anode layer 108 is filled into the contact opening 114 for electrically connecting to the source/drain 104. A red, green and blue light organic luminescent layer 110 is configured on the ITO anode layer 108 and the passivation layer 106. The cathode layer 112 is configured on the organic luminescent layer 110. Because of the large step height of the surface of the ITO anode layer 108 and the passivation layer 106, particularly at the place marked A corresponding to the contact opening 114, and at the place marked B corresponding to the edge of the source/drain 104, the thickness of the organic luminescent layer 110 thereof will be reduced and the cathode layer 112 easily contacts with the anode layer 108 resulting in shorting.

Additionally, in the conventional method of forming the organic luminescent layer 110, the shadow mask directly contacts the anode layer and the passivation layer and the organic luminescent layer are formed thereon by sputtering. The shadow mask is then removed to repeat the sputtering process for several times to form the red, green and blue organic luminescent layers on the anode layer and the passivation layer, respectively. During the sputtering processes, because the shadow mask is repeatedly made to come in contact to and then separated from the TFT substrate, damage will result therefrom adversely affecting the performance of the device.

SUMMARY OF INVENTION

Therefore, an object of the present invention is to provide an active organic electroluminescence panel display and a fabricating method thereof for avoiding the shorting of the anode and cathode layers at the place corresponding to the contact opening and the edge of the source/drain terminals.

The other object of the present invention is to provide an active organic electroluminescence panel display and a fabricating method thereof for avoiding the damage resulting from the use of a shadow mask directly contacting the substrate for forming the organic luminescent layer.

The present invention discloses an active organic electroluminescence panel display, which comprises a thin film transistor array, a passivation layer, an anode layer, a blank layer, an organic luminescent layer and a cathode layer. The thin film transistor array is configured on a substrate, wherein the thin film transistor array comprises a plurality of thin film transistors, a plurality of scan lines and a plurality of data lines. The passivation layer is configured on the thin film transistor array, wherein the passivation layer comprises a plurality of contact openings exposing a prescribed area thereof. The anode layer is configured on the passivation layer and fills into the contact openings. The blank layer is configured on the anode layer and the contact openings are covered thereby. The organic luminescent layer is configured on the anode layer. The cathode layer is configured on the organic luminescent layer.

In a preferred embodiment of the present invention, the display further comprises a planarization layer on the blank layer. The planarization layer has a contact opening therein exposing a prescribed area of the thin film transistor. The anode is configured on the planarization layer and fills into the contact openings. The blank layer is configured on the anode layer and the contact openings are covered thereby. The anode layer is covered with the organic luminescent layer. The cathode layer is configured on the organic luminescent layer.

The present invention also discloses a method of fabricating an active organic electroluminescence panel display, which comprises: forming a thin film transistor array on a substrate, wherein the thin film transistor array comprises a plurality of thin film transistors, a plurality scan lines and a plurality of data lines; forming a passivation layer over the substrate and covering the thin film transistor array; forming contact openings within the passivation layer for exposing a prescribed area of the thin film transistor array; forming an anode layer on the passivation layer, filling within the contact openings; forming a blank layer on the anode layer, covering the contact openings; forming an organic luminescent layer over the contact openings by disposing a shadow mask over the blank layer; removing the shadow mask; and forming a cathode layer on the organic luminescent layer.

In a preferred embodiment of the present invention, the method further comprises forming a planarization layer on the blank layer and forming contact openings therein for exposing a prescribed area of the thin film transistor. The anode is formed on the planarization layer and fills the contact openings. The blank layer is on the anode layer and covers the contact openings. The organic luminescent layer is formed over the anode layer by disposing a shadow mask over the blank layer and by a sputtering process. The shadow mask is then removed. The cathode layer is formed on the organic luminescent layer. Thus, the fabrication of the active organic electroluminescence panel display is completed.

Accordingly, the present invention forms the blank layer at the place corresponding to the contact openings and the edge of the source/drain terminals for planarizing the structure of the panel. The step height of the structure can be reduced and the shorting of the anode and cathode layers resulting from the over-thick organic luminescent layer thereat can be avoided. Additionally, the present invention uses the blank layer for supporting the shadow mask during the deposition the organic luminescent layer. Therefore, the damage resulting from the contact between the shadow mask and the organic luminescent layer during the deposition process thereof can be evaded.

In order to make the aforementioned and other objects, features and advantages of the present invention understandable, a preferred embodiment accompanied with figures is described in detail below.

DETAILED DESCRIPTION

Figure 1:
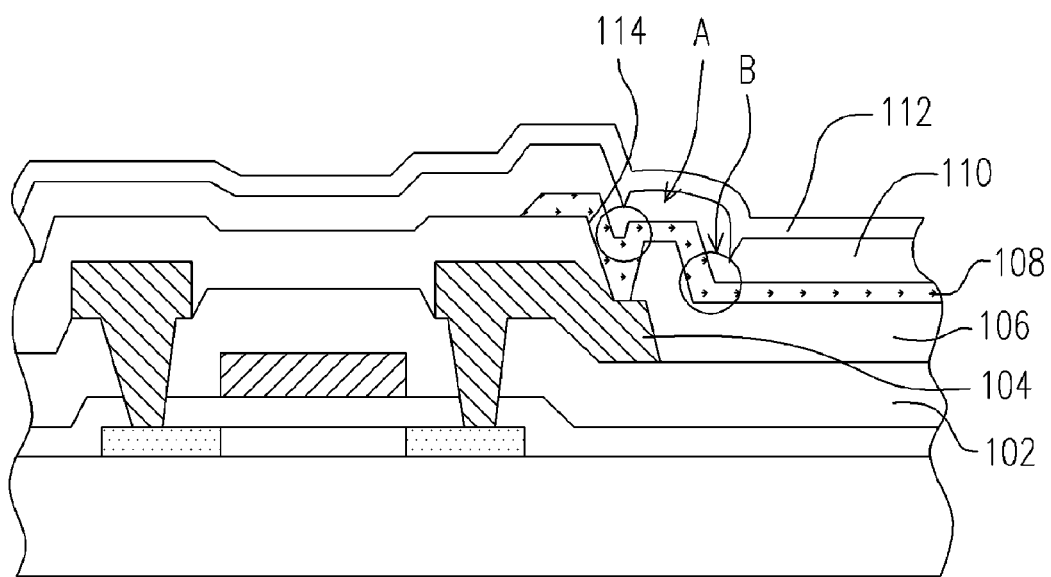
FIG. 1 is a schematic cross-sectional view showing a conventional active organic electroluminescence panel display.
Figure 2A:
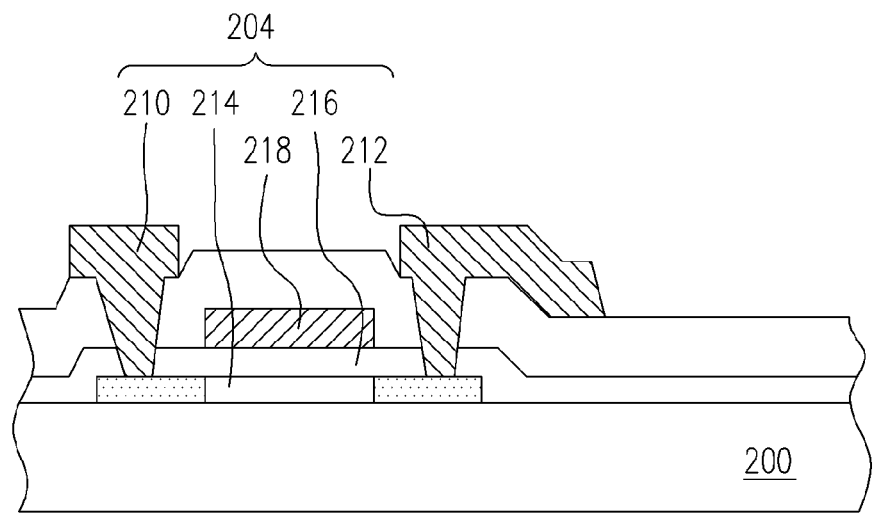
FIGS. 2A-2F are a schematic manufacturing process flow of an active organic electroluminescence panel display of the present invention.
Figure 2B:
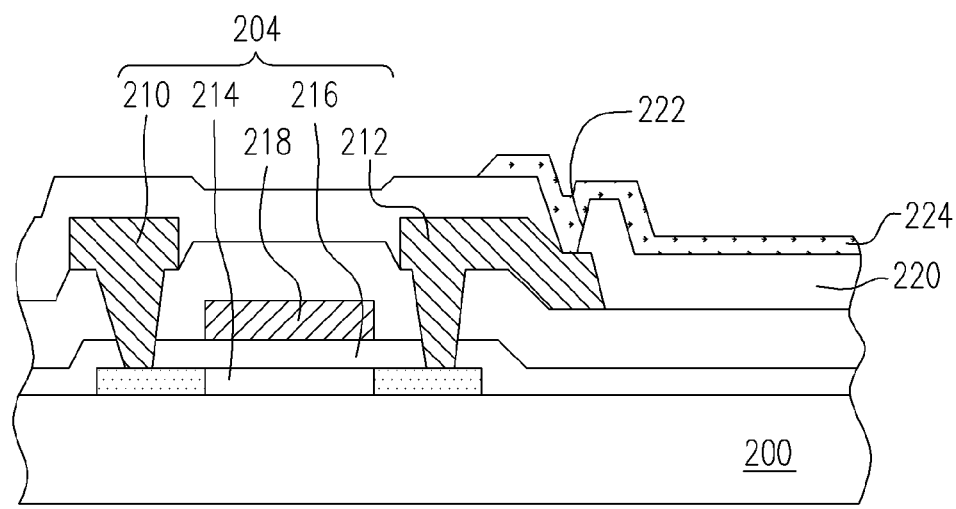
Figure 4A:
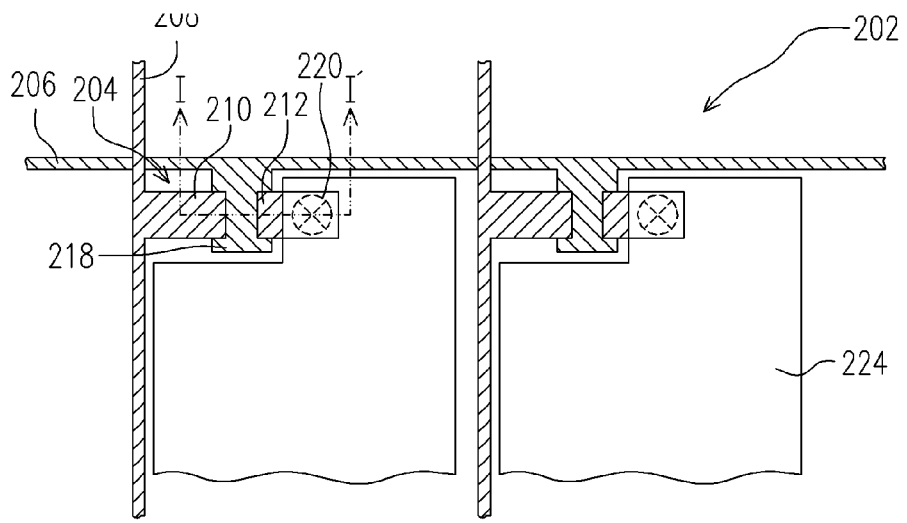
FIG. 4A is a top view of FIG. 2A and FIG. 2B.

FIGS. 2A-2F is a schematic process flowchart illustrating a process of fabricating an active organic electroluminescence panel display according to a preferred embodiment of the present invention. FIG. 4A is a top view of FIG. 2A. FIGS. 2A and 2B are the cross-sectional views taken along I-I" in FIG. 4A.

Referring to FIGS. 2A and 4A, a thin film transistor array 202 is formed on a substrate 200, wherein the thin film transistor array 202 comprises a plurality of thin film transistors 204, a plurality of scan lines 206 and a plurality of data lines 208. The thin film transistor 204 can be, for example, a polysilicon thin film transistor, which comprises a source terminal 210, a drain terminal 212, a channel 214, a gate dielectric layer 216 and a gate terminal 218. The scan lines 206 of the thin film transistor array 202 electrically connect with the gate terminal 218 and the data lines 208 electrically connect with the source 210.

Moreover, in addition to being formed by one type of transistors, such as the polysilicon thin film transistor, the array can be composed of two types of transistors, such as a CMOS transistor composed of a N-type and a P-type transistor. Additionally, lightly doped drains (LDD) (not shown) can be formed within the polysilicon thin film transistor 204.

Referring to FIGS. 2B and 4A, a passivation layer 220 is formed over the substrate 200 and covers the thin film transistor array. The passivation layer 220 can be, for example, silicon nitride and formed by a chemical vapor deposition (CVD) process formed thereon. Then, a contact opening 222 is formed within the passivation layer 220 for exposing a prescribed area of the array, such as the source terminal 210 or the drain terminal 212. The contact opening can be formed, for example, by performing a photolithographic process and an etching process. An anode layer 224 is formed on the passivation layer 220 and fills within the contact openings 222. The anode layer 224 can be formed, for example, by sputtering indium tin oxide (ITO) (not shown) on the passivation layer 220, and patterning the ITO layer by performing a photolithographic process and an etching process. The slope sidewall of the anode layer 224 is formed by controlling the etching parameters.

Figure 2C:
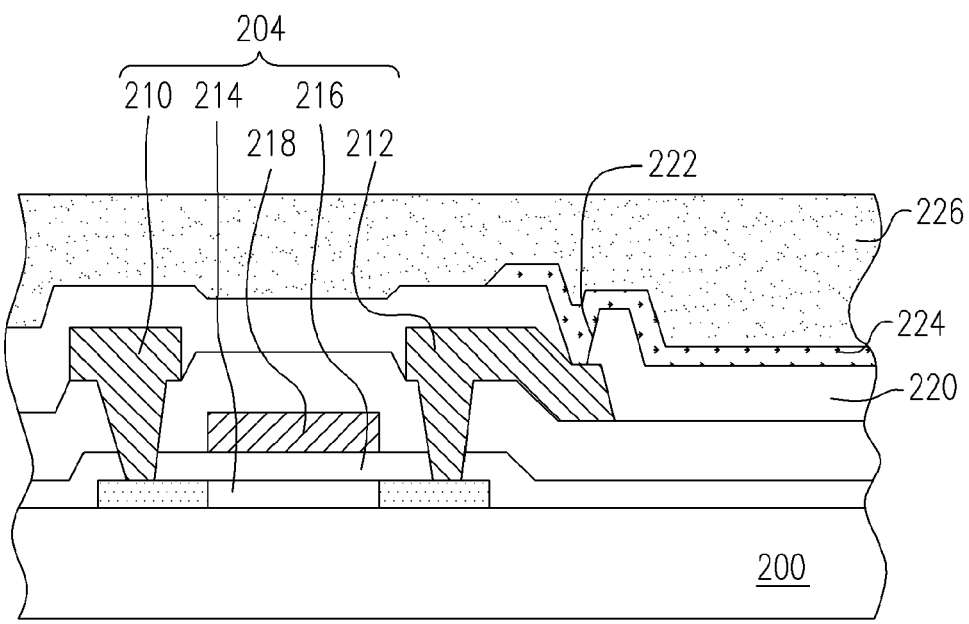

Referring to FIG. 2C, a photo-sensitive layer 226 is spin-coated on the anode layer 224 for planarizing the structure. The photo-sensitive layer 226 has a thickness from about 0.5 µm to about 3 µm.

Figure 2D:
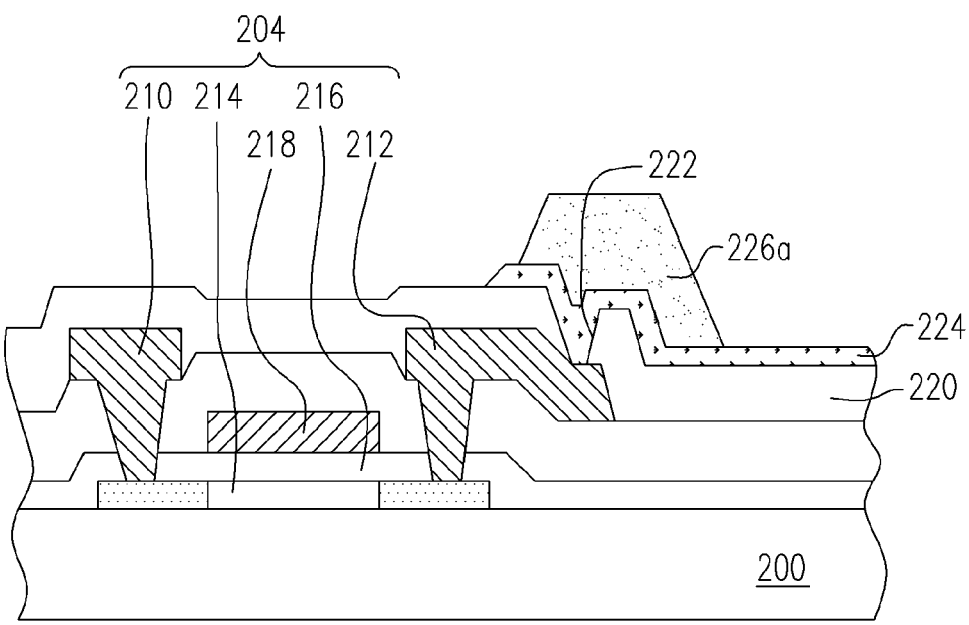
Figure 4B:
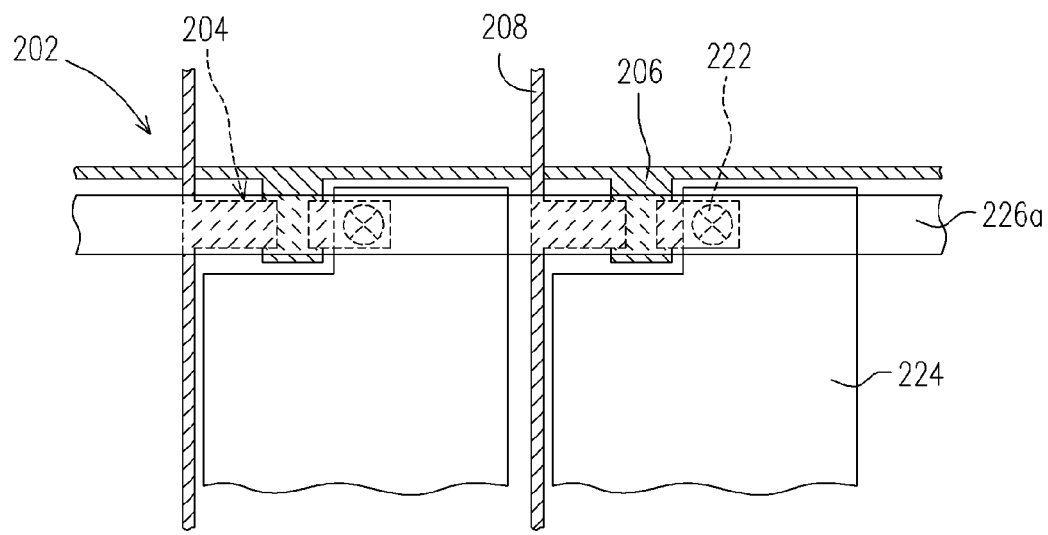
FIG. 4B is a schematic top view showing an active organic electroluminescence panel display according to a preferred embodiment of the present invention.

Referring to FIGS. 2D and 4B, the photo-sensitive layer 226 is patterned by a photolithographic process and an etching process for forming the blank layer 226a covering the contact opening 222 and the edge of the source terminal 210 or the drain terminal 212. The blank layer 226a is, for example, a continuous pattern along direction of the scan lines 206.

Additionally, the blank layer 226a can also be, for example, a continuous pattern along direction of the data lines 208. Of course, the blank layer 226a can be a non-continuous pattern, such as a block pattern (not shown), on the anode layer 224 at the place corresponding to the contact opening 222 and the edge of the source terminal 210 or the drain terminal 212.

Figure 2E:
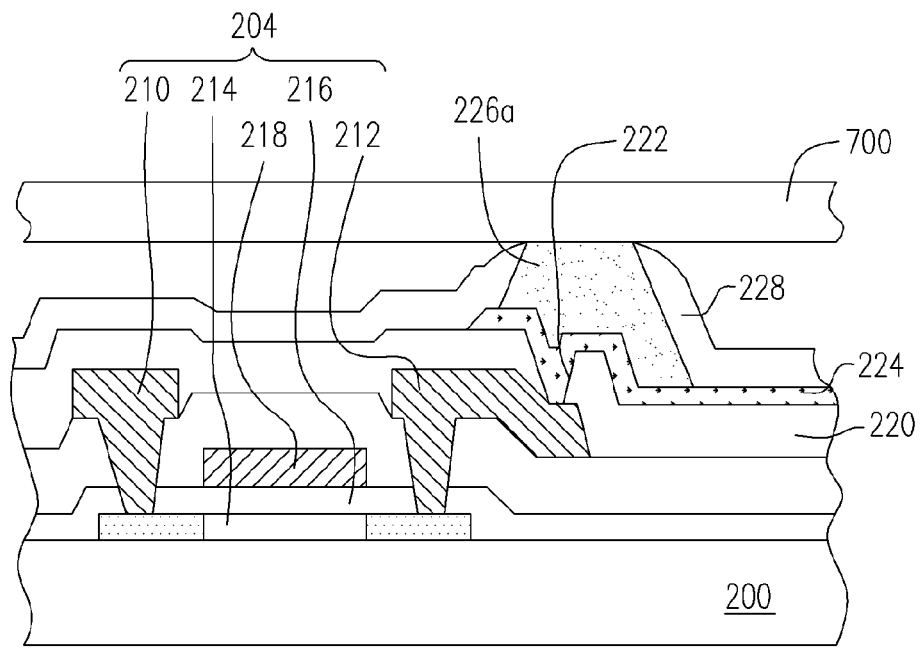

Referring to FIG. 2E, a shadow mask 700 is disposed on the blank layer 226a for performing a deposition process, such as sputtering, for forming an organic luminescent layer 228 on the anode layer 224, covering the passivation layer 220 and the blank layer 226a.

Figure 2F:
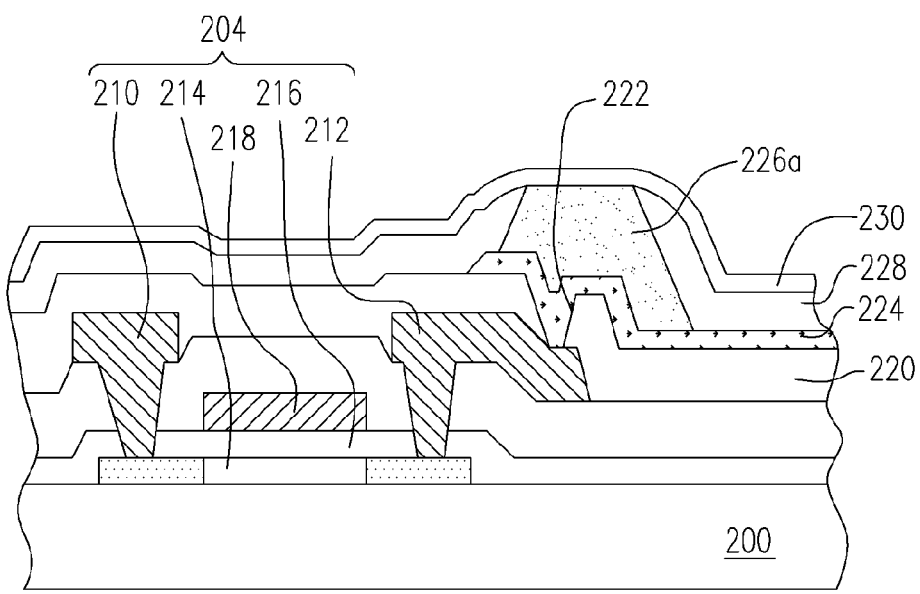
Figure 3:
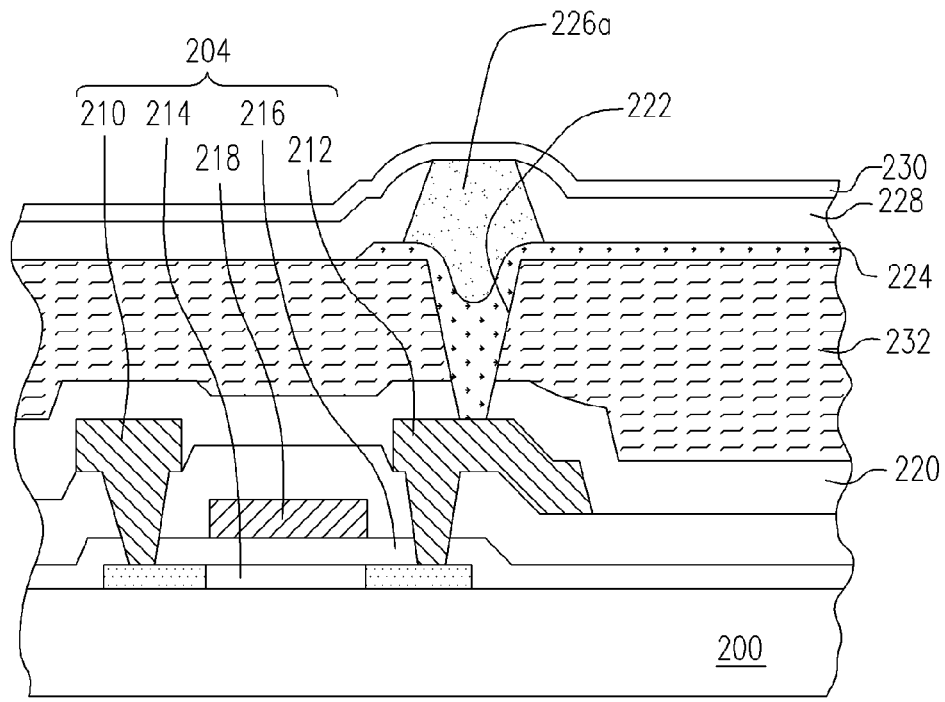
FIG. 3 is a schematic cross-sectional view showing an active organic electroluminescence panel display according to another preferred embodiment of the present invention.

Referring to FIG. 2F, the shadow mask is then removed. A cathode layer 230 is formed on the organic luminescent layer 228 and thereby completing the fabrication of the active organic electroluminescence panel display. The method of forming the cathode layer 230 can be, for example, sputtering.

FIG. 2F is a schematic cross-sectional view of a single pixel of the active organic electroluminescence panel display of the present invention. However, the pixel structure can use different organic luminescent layers 228 depending on the light emitted therefrom. For forming R, G and B organic luminescent layers 228 on the anode layer 224, the shadow mask should be used three times for performing deposition processes thereof.

Referring FIGS. 2F and 4B, the active organic electroluminescence panel display formed by the method described above comprises the thin film transistor array 202, the passivation layer 220, the anode layer 224, the blank layer 226a, the organic luminescent layer 228 and the cathode layer 230. The thin film transistor array 202 is formed on the substrate 200 and comprises plurality of thin film transistors 204, a plurality of scan lines 206 and a plurality of data lines 208. The thin film transistor 204 can be, for example, a polysilicon thin film transistor, which comprises the source terminal 210, the drain terminal 212, the channel 214, the gate dielectric layer 216 and the gate terminal 218. The passivation layer 220 is over and covers the thin film transistor array 202. The contact opening 222 is formed within the passivation layer 220 for exposing a prescribed area of the array, such as the source terminal 210 or the drain terminal 212. The anode layer 224 is formed on the passivation layer 220 and fills within the contact opening 222. The blank layer 226a is on the anode layer 224 and covers the contact opening 222 and the edge of the source terminal 210 or the drain terminal 212. The organic luminescent layer 228 is on the anode layer 224. The cathode layer 230 is formed on the organic luminescent layer 228.

In another preferred embodiment, a planarization layer is formed for increasing the opening ratio of the display before forming the anode layer. Referring to 3, a planarization layer 232 is formed on the passivation layer 220 after the passivation layer 220 is formed on the thin film transistors array. The planarization layer 232 can be, for example, an organic material. A contact opening 220a is then formed therein for exposing the source terminal 210 or drain terminal 212. The anode layer 224 is formed on the planarization layer 232 and fills within the contact opening 222a for electrically connecting the anode layer 224 and the source terminal 210 or drain terminal 212. The blank layer 226a is formed on the anode layer 224 at the place corresponding to the contact opening 222a and the edge of the source terminal 210 or drain terminal 212 which are along the data line or scan line. The organic luminescent layer 228 is on the anode layer 224 and covers the planarization layer 232 and the blank layer 226a. The cathode layer 230 is formed on the organic luminescent layer 228. Thus, the active organic electroluminescence panel display is formed.

In addition to being applied to the active organic electroluminescence panel display formed by polysilicon thin film transistors, the present invention can be also applied to the active organic electroluminescence panel display composed of amorphous silicon thin film transistors.

Figure 5:
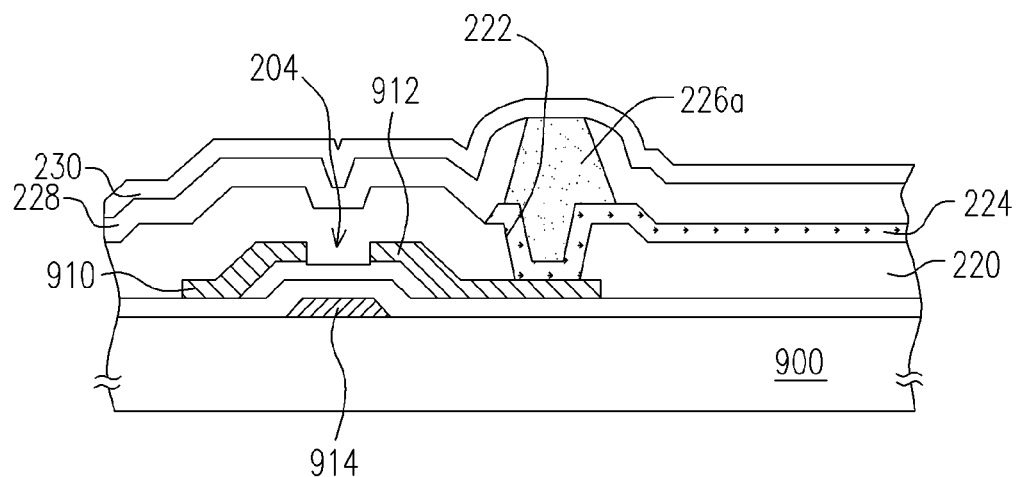
FIG. 5 is a schematic cross-sectional view showing an active organic electroluminescence panel display according to another preferred embodiment of the present invention.

Referring to FIGS. 5 and 4A, the thin film transistor array 202 is formed on the substrate 900 and comprises a plurality of thin film transistors 204, a plurality of scan lines 206 and a plurality of data lines 208. The thin film transistor 204 can be, for example, an amorphous silicon thin film transistor, which comprises the source terminal 910, the drain terminal 912 and the channel 914. The scan line 206 of the thin film transistor array 202 electrically connects with the gate terminal 914 and the data line 208 electrically connects with the source terminal 910. The passivation layer 220 is formed and covers the thin film transistor array 202. The contact opening 222 is formed within the passivation layer 220 for exposing the source terminal 910 or the drain terminal 912. The anode layer 224 is formed on the passivation layer 220 and fills within the contact opening 222 for electrically connecting the anode layer 224 and the source terminal 910 or the drain terminal 912.

Figure 4C:
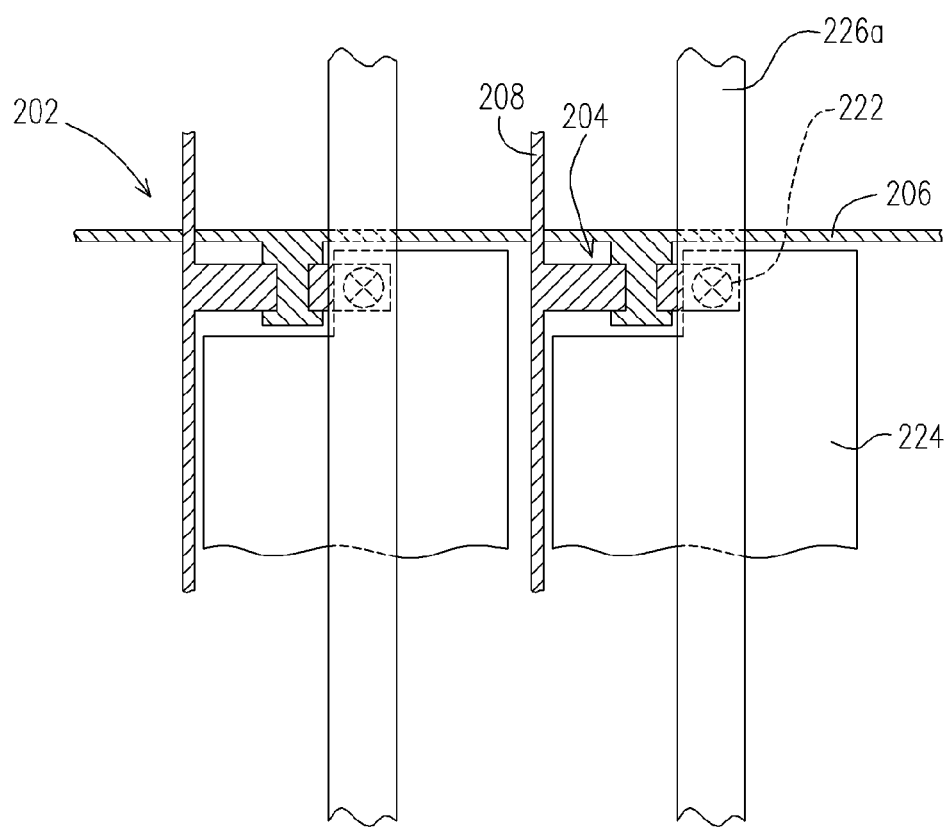
FIG. 4C is a schematic top view showing an active organic electroluminescence panel display according to another preferred embodiment of the present invention.

Referring to FIGS. 4B, 4C and 5, the blank layer 226a is formed on the anode layer 224 and covers the contact opening 222 and the edge of the source terminal 910 or the drain terminal 912. The organic luminescent layer 228 is formed on the blank layer 226a for covering the passivation layer 220 and the anode layer 224. The cathode layer 230 is formed on the organic luminescent layer 228. Finally, the active organic electroluminescence panel display is formed.

Figure 6:
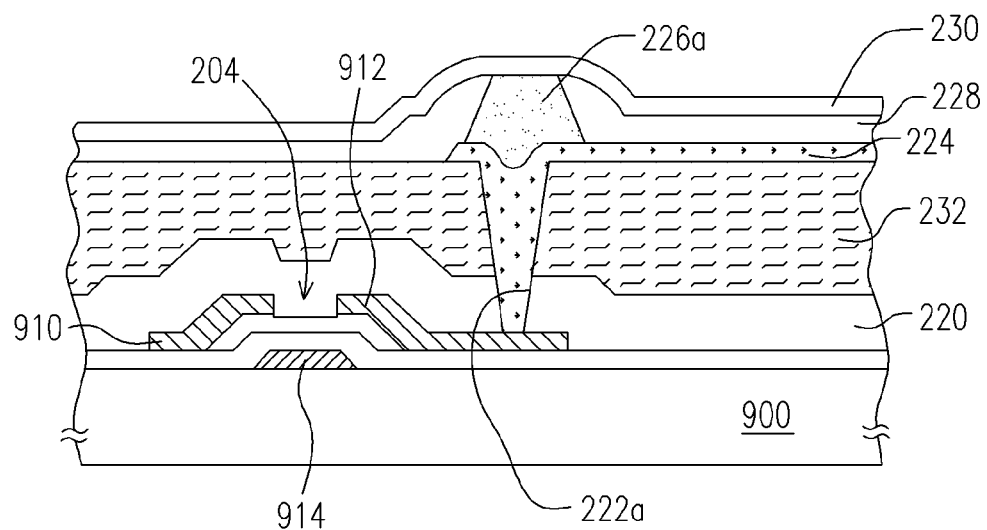
FIG. 6 is a schematic cross-sectional view showing an active organic electroluminescence panel display composed of amorphous silicon thin film transistors according to a preferred embodiment of the present invention.

Similarly, a planarization layer 232 can also be formed on the passivation layer 220 for increasing the opening ratio of the display composed of amorphous thin film transistors as shown in FIG. 6. Referring to 4B, 4C and 6, the planarization layer 232 is formed on the passivation layer 220 after the passivation layer 220 is formed on the thin film transistors array 902. The planarization layer 232 can be, for example, an organic material. A contact opening 220a is then formed therein for exposing the source terminal 910 or drain terminal 912. The anode layer 224 is formed on the planarization layer 232 and fills within the contact opening 222a for electrically connecting the anode layer 224 and the source terminal 910 or drain terminal 912. The blank layer 226a is formed on the anode layer 224 at the place corresponding to the contact opening 222a and the edge of the source terminal 910 or drain terminal 912 which are along the data line or scan line. The organic luminescent layer 228 is on the anode layer 224 and covers the planarization layer 232 and the blank layer 226a. The cathode layer 230 is formed on the organic luminescent layer 228. Finally, the active organic electroluminescence panel display is formed.

The present invention forms a blank layer on the passivation layer at the place corresponding to the contact openings or having an obvious step height for avoiding the shorting of the anode and cathode layers resulting from the over-thick organic luminescent layer thereat.

Additionally, the present invention uses the blank layer for supporting the shadow mask during depositing the organic luminescent layer. Therefore, the shadow mask does not directly contact with the organic luminescent layer or the anode layer. The damage resulting from the contact between the shadow mask and the organic luminescent layer during the deposition process thereof can be evaded.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An active organic electroluminescence panel display, comprising:
   a thin film transistor array on a substrate, wherein the thin film transistor array comprises a plurality of thin film transistors, a plurality of scan lines and a plurality of data lines;
   a passivation layer on the thin film transistor array, wherein the passivation layer comprises a contact opening exposing a prescribed area thereof;
   an anode layer on the passivation layer, filling within the contact opening;
   a blank layer on the anode layer, covering the contact opening;

an organic luminescent layer on the anode layer and an area of the passivation layer which are uncovered by the anode layer and the blank layer; and a cathode layer on the organic luminescent layer.

2. The active organic electroluminescence panel display of claim 1, wherein the blank layer includes a photosensitive material.

3. The active organic electroluminescence panel display of claim 1, wherein the blank layer has a thickness from about 0.5 μm to about 3 μm.

4. The active organic electroluminescence panel display of claim 1, further comprising a planarization layer on the passivation layer, the contact opening formed within the passivation layer and the planarization layer.

5. The active organic electroluminescence panel display of claim 4, wherein the planarization layer is an organic material.

6. The active organic electroluminescence panel display of claim 1, wherein a sidewall of the anode layer is a slope.

* * * * *